United States Patent [19]

So et al.

[11] Patent Number: 4,638,302

[45] Date of Patent: Jan. 20, 1987

[54] DIGITAL-TO-ANALOG CONVERTER

[75] Inventors: Eddy So; William J. M. Moore, both of Ottawa, Canada

[73] Assignee: Canadian Patents and Development Limited-Societe Canadienne des Brevets et d'Exploitation Limitee, Ottawa, Canada

[21] Appl. No.: 766,136

[22] Filed: Aug. 15, 1985

[51] Int. Cl.[4] .......................................... H03K 13/02
[52] U.S. Cl. ...................... 340/347 DA; 340/347 CC; 340/347 M
[58] Field of Search .... 340/347 DA, 347 M, 347 CC; 324/99 D

[56] References Cited

U.S. PATENT DOCUMENTS 3,688,301 8/1972 Suzuki et al. ............... 340/347 DA
3,926,056 12/1975 Brown ........................... 324/99 D X

OTHER PUBLICATIONS

MacMartin et al, A Self-Balancing Direct Current Comparator . . . , IEEE Transactions on Magnetics, vol. Mag-1, No. 4, 12/1965, pp. 396–402.
Souders, A 20 Bit + Sign Switched D/A Converter, National Bureau of Standards Technical Note 1105, 10/1979, pp. 1–16.

Primary Examiner—T. J. Sloyan

[57] ABSTRACT

A converter for converting a series of digital input bits to an analog output employs a direct current comparator having a magnetic core and primary and secondary ratio windings coupled with the core. The primary winding is divided into two sections. A first group of the more significant input bits varies the number of turns of the first primary section which is traversed by a first direct current. A second group of less significant input bits varies the number of turns of the second primary section traversed by a second direct current. A direct current is also passed through the secondary winding, this secondary current being varied proportionally with the number of turns of the first primary section traversed by the first primary current. Modulation-detection windings arranged inside the core (which also acts as a magnetic shield) detect any net ampere-turns unbalance of the primary and secondary currents in the ratio windings. Detection of such an unbalance further varies the secondary current to tend to bring the unbalance to zero. The analog output is proportional to the secondary current. The splitting of the primary winding into two sections enables the converter to handle a larger number of bits, e.g. 20, than would be possible with a prior art type of primary winding, without the number of turns becoming unmanageably large.

3 Claims, 1 Drawing Figure

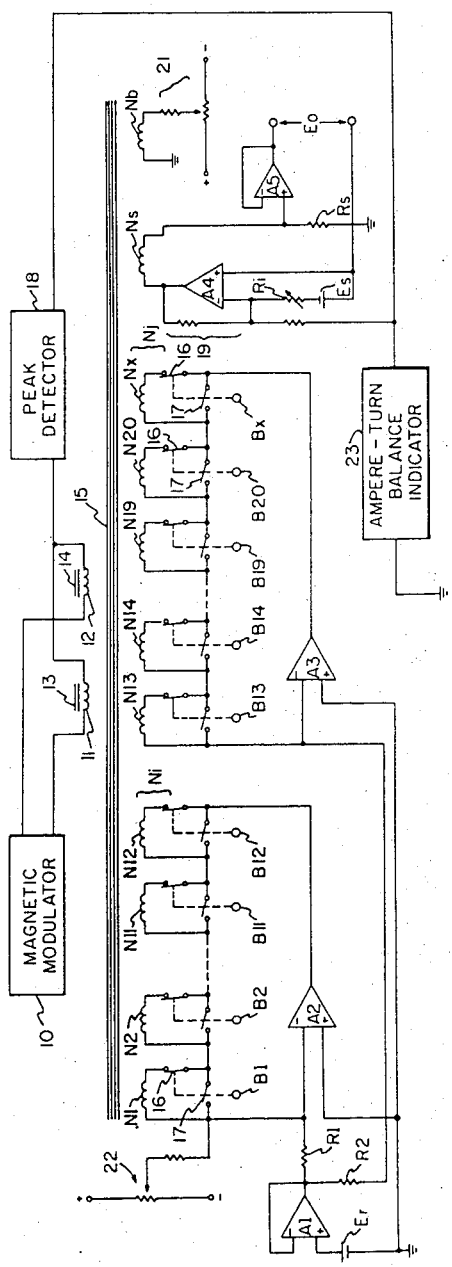

DIGITAL-TO-ANALOG CONVERTER

BACKGROUND OF THE INVENTION

The present invention relates to a digital-to-analog converter (hereinafter DAC), and particularly a DAC that is high in accuracy, while at the same time permitting operation with a relatively large number of bits, for example, at least 20 bits.

PRIOR ART

A conventional DAC is described in a paper by T. M. Souders et al entitled "A 20 Bit+Sign, Relay Switched D/A Converter" published in National Bureau of Standards Technical Note 1105, October 1979. This traditional type of DAC employs a series of resistors and relays in a ladder network. Its accuracy is subject to variations of temperature coefficients among the resistors, to variations of contact resistances in the relays and to thermal voltages.

To avoid these difficulties, it has been proposed to replace the ladder network of resistors with a direct current comparator. The theory of operation of a direct current comparator is explained in a paper of M. P. MacMartin et al entitled "A Self-Balancing Direct Current Comparator for 20 000 Amperes" published in IEEE Transactions on Mechanics, December 1965, pages 396 to 402.

Such a use of a direct current comparator in a DAC has been proposed by T. Suzuki et al in U.S. Pat. No. 3,688,301 issued Aug. 29, 1972.

SUMMARY OF THE PRESENT INVENTION

The present invention addresses itself to certain problems of the apparatus disclosed in the Suzuki et al patent, and has the objective of providing a DAC that will perform with a larger number of bits than is possible with the Suzuki device, without the number of turns of the comparator becoming unmanageably large.

This objective is achieved by splitting the primary ratio winding into two (or more) sections.

More specifically, the invention consists of a converter for converting a series of digital input bits to an analog output, comprising, (b) a) magnetic core means, (b) primary and secondary ratio windings coupled with the core means, (c) the primary winding being divided into at least two sections, (d) means for passing a first predetermined primary direct current through a first of said sections, (e) means controlled by a first group of the more significant input bits for varying the number of turns of said first section traversed by the first current, (f) means for passing a second predetermined primary direct current through a second of said sections, (g) means controlled by a second group of less significant input bits for varying the number of turns of said second primary section traversed by the second current, (h) means for passing a secondary direct current through the secondary winding, including means for varying said secondary current proportionally with the number of turns of the first primary section traversed by the first primary current, (i) means coupled with the core means for detecting a net ampere-turns unbalance of the primary and secondary currents in said ratio windings, (j) means controlled by said detecting means for further varying the secondary current to tend to bring said unbalance to zero, and (k) an analog output proportional to the secondary current.

BRIEF DESCRIPTION OF THE DRAWING

An embodiment of the present invention is illustrated diagrammatically in the single figure of the attached drawings.

DETAILED DESCRIPTION OF THE PREFERRED EMBODIMENT

A magnetic modulator 10 is employed to energize a pair of modulation-detection windings 11, 12, each wound on a respective modulator core 13, 14. The cores 13, 14 are a pair of side-by-side cores, each toroidal and each formed of high-permeability magnetic material. A magnetic shield 15 in the form of a hollow toroid surrounds the cores 13 and 14 and acts as a core for outer, "ratio" windings. The ratio windings consist of a secondary winding Ns and two primary winding sections Ni and Nj, each having an adjustable number of turns. For convenience, these primary winding sections have been illustrated as separate portions depending upon the number of turns chosen by switched taps.

Each bit of the digital input will be applied to a respective terminal B1-B20 and will operate a relay (not shown) having contacts 16 and 17. As illustrated, when each contact 16 is closed its corresponding contact 17 is open, and vice versa. In the position illustrated, namely with all the contacts 16 closed and all the contacts 17 open, all twelve portions N1, N2 ... N11 and N12 of the primary winding section Ni and all eight portions N13, N14 ... N19 and N20 of the primary winding section Nj are in circuit. When any one of the contacts 17 is closed, with consequential opening of its associated contact 16, that particular portion of the winding section Ni or Nj is taken out of circuit. The most significant bit B1 of the 20-bit digital input controls the most significant winding portion N1 which has 2,048, i.e. $2^{n-1}$, turns, where n is the number of bits in the first section, namely $2^{11}$ turns. The next most significant bit B2 controls the winding portion N2 which has 1,024 ($2^{10}$) turns, and so on, until bit B12, which is the least significant bit of this first group of bits and which controls the winding portion N12 consisting of only a single turn. Winding portion N11 has two turns and the intermediate winding portions N10 to N3 (not shown) have, respectively 4, 8, 16, 32, 64, 128, 256, and 512 turns. The total number of turns on the entire primary winding section Ni is thus $2^n-1$, i.e. 4,095.

In a like fashion, the second primary winding section Nj is divided into eight portions identified respectively as N13, N14 ... N19 and N20 controlled by the input bits B13, B14 ... B19 and B20, respectively, these being numbered in descending order of significance. The number of turns in the respective winding portions N20 to N13 is 1, 2, 4, 8, 16, 32, 64 and 128.

As will be explained later, the winding section Nj has a further, single turn portion Nx which is controlled from a terminal Bx and is used for purposes of calibration and performance checking. Apart from this extra calibration turn, the total number of turns in the second primary winding section Nj is $2^m-1$, where m is the number of bits in the second section. When m=8, this total number becomes 255, or, with the calibration turn 256. Hence the total number of turns for the entire primary winding (Ni and Nj together) is 4,351.

The number of turns in the secondary winding Ns will be $2^n$, which in the present case is 4096.

A reference voltage Er, buffered by a low drift and offset, high gain follower amplifier A1, provides, through a resistor R1 and an amplifier A2, a constant current that flows through the winding section Ni, and, through a resistor R2 (equal to 256 times the resistance of the resistor R1), and an amplifier A3, a constant current that flows through the winding section Nj.

The cores 13, 14, magnetic shield 15, magnetic modulator 10 and peak detector 18 can be similar to those used in the MacMartin paper referred to above. The magnetic modulator 10 is conveniently a square wave oscillator, with a frequency of approximately 1 kHz. The cores 13, 14 are driven into saturation twice per cycle by this modulator. The output of the modulation-detection windings 11, 12 is a peaked alternating voltage of mainly fundamental frequency. Direct current in the ratio windings adds even harmonics to this signal, increasing the amplitude of the peaks of one polarity and decreasing that of the opposite polarity peaks. The peak detector 18 generates a direct voltage proportional to the difference between the amplitudes of the positive and negative peaks, and this output is thus proportional to the net direct current in the ratio windings.

The magnetic shield 15 shields the cores 13, 14 from external fields and winding leakage fluxes, so that any need for a special environment or for very careful ratio winding distribution is effectively eliminated. The shield 15 also suppresses the currents that would otherwise be induced by the modulator 10 in the ratio windings.

The comparator is self-balancing by virtue of a slave power supply 19 controlled by a signal from the peak detector 18. This slave power supply 19 acts as a feedback system to control the current in the secondary winding Ns in such a way as to keep the net ampere-turns in the ratio windings equal to zero. The system thus performs like a current transformer that operates down to zero frequency, i.e. direct current. The slave power supply 19 consists of a voltage source Es and an amplifier A4. When the peak detector 18 indicates an ampere-turn unbalance, its output signal controls the amplifier A4 in a feedback manner to bring the current in the winding Ns back into balance, i.e. zero ampere-turns in the three ratio windings (Ni, Nj and Ns) taken together.

The analog output Eo is a voltage across a resistor Rs in series with the secondary winding Ns, supplied through an output amplifier A5. This will be a low drift and offset, unity-gain, low-pass, active filter having an 80 db attenuation in the range from about 100 Hz to 1 kHz. It buffers the output of the converter, providing a low output impedance, and reduces the component of the output voltage due to currents induced by the modulator 10 in the ratio windings. While the coupling between the modulator 10 and the ratio windings is very substantially reduced by the magnetic shield 15, the permeability of the material of such shield is finite and isolation is not complete. The amplifier A5 reduces this effect in the output voltage Eo.

To be more specific about the performance of the system, it should be explained that the automatic balance of the net ampere-turns is achieved by means of an open-loop control that gives coarse balance and a closed-loop control that gives fine balance. The open-loop control is provided by the slave power supply 19, which is, in effect, an ampere-turn tracking circuit. The coarse balance is controlled by an adjustable programming resistor Ri. This resistor is automatically adjusted by conventional means (not shown) to the various positions of the switches 16, 17, so that its value corresponds at any given time to the number of turns in circuit in the first primary winding section Ni (controlled by the 12 most significant bits). This open-loop control causes the current in the secondary winding Ns to keep the net ampere-turns approximately zero.

No similar ampere-turn tracking is provided for the second primary winding section Nj which responds to the least significant 8 bits. The closed-loop gain is sufficiently high to correct any changes in the slave power supply due to temperature variations, and to keep the net ampere-turns in balance at zero even though no ampere-turn tracking is provided for the last 8 bits. An ampere-turn balance indicator 23 is connected to the output of the peak detector. The indicator 23 is a simple, null reading volt meter. It is optional and is provided merely to indicate to the operator that the system is working correctly, without cooperating with the remainder of the circuit.

For zero net ampere turns in the windings, $$Eo = \frac{ErRs}{R1Ns}\left[\sum_{1}^{12} Ni + \frac{1}{256}\sum_{13}^{20} Nj\right] \quad (1)$$

where:
$Ni = (2)^{12-i}$ turns for $1 \leq i \leq 12$
$Nj = (2)^{20-j}$ turns for $13 \leq j \leq 20$
$Ns = 4096$ turns.

In more general terms $$Eo = \frac{ErRs}{R1\,2^n}\left[\sum_{1}^{n} Ni + \frac{1}{2^m}\sum_{n+1}^{n+m} Nj\right] \quad (2)$$

where:
the ratio of the first and second primary currents is $2^m$,
$Ni = (2)^{n-i}$ turns for $1 \leq i \leq n$
$Nj = (2)^{n+m-j}$ turns for $n+1 \leq j \leq n+m$
$Ns = (2)^n$ turns.

For zero net ampere-turns in the ratio windings, the output current in the resistor Rs is exactly proportional to the number of turns of the primary winding sections Ni and Nj in circuit at any one time. By making R2 equal to $2^m$, i.e. 256, times R1, the portions N1–N12 of the winding section Ni are caused to correspond to the most significant 12 bits, i.e. bits B1 to B12, while the portions N13–N20 of the winding section Nj are caused to correspond to the least significant bits B13 to B20 of the digital input.

Since the winding portions N1 to N12 and N13 to N20 are arranged in the feedback of a respective amplifier A2, A3, contact resistances and thermal voltages in the switching of these winding portions do not present a problem.

The DAC can be adjusted for proper operation by a simple, self-calibration procedure, only two adjustments being required, namely a zero adjust and a full scale adjust.

The output of the DAC should be zero for zero digital input. However, this may not be true, due to the offset of the output amplifier A5 and also due to any core mismatch. Any core mismatch will cause zero current in the ratio windings to not necessarily correspond to zero second harmonic components in the modulator output. The closed-loop control from the peak detector 18 would then cause a current in the secondary winding Ns, thus driving the second harmonic component in the modulator output to zero, resulting in a voltage across the output resistor Rs. The effect of such a core mismatch and of any offset of the output amplifier A5 can be cancelled by a variable voltage zero adjust 21 which injects an adjustable current into a ten-turn, bias winding Nb. While an offset in the peak detector 18 or the slave power supply 19 could also cause a current in the secondary winding Ns, resulting in a voltage across the output resistor Rs, the closed-loop control will tend to drive this current to zero and keep the net ampere-turn unbalance at zero.

The ratio of the resistors Rs and R1 should ideally be exactly 1. However, due to mismatch, this may not necessarily be so. Such mismatch and any offsets in the amplifiers A1 and A2 can cause a gain error in the output voltage. This error can be adjusted to zero by a full-scale adjust 22 which injects an adjustable current into the winding section Ni. Adjustment is carried out by switching all bits B1 to B20 ON, plus terminal Bx which controls the extra turn Nx, i.e. all switches 16 closed. The output voltage Eo should then be equal to the reference voltage Er. In other words, with all the turns of the winding sections Ni and Nj in circuit, the voltage Eo is compared with the voltage Er by suitable means, such as a null detector, and the adjust 22 used to correct any unbalance. The gain error due to offsets in the amplifier A3 is negligible, since such error affects only the accuracy of the last eight bits of the converter.

The essential difference between the present arrangement and that disclosed by Suzuki et al resides in the fact that the present arrangement divides the primary winding into two sections Ni and Nj. Suzuki et al use a single input winding Wi with variable turns. A switch S selects the number of turns in accordance with the digital input. As was typical around 1970 when the Suzuki et al apparatus was designed, there was only need for such converters to function with what now appears to be a relatively small number of bits, typically 12 bits. If the Suzuki et al apparatus were to operate with 12 bits, for example, the minimum number of turns on the winding Wi would have to be 4,095, with a similar number of turns, e.g. 4096, required on the output winding Wo, for a total of just over 8000 turns. This is a practical number. However, if any attempt were made to expand the Suzuki et al device to work with say 20 bits (a typical modern requirement), the number of turns on each of the windings Wi and Wo would have to be $2^{20}-1$, and $2^{20}$, respectively, namely over a million. A total for both windings of over two million turns would be physically unmanageable in an apparatus of acceptable size.

The present invention achieves the ability to expand the number of bits that can be handled by a Suzuki et al type of DAC while keeping the total number of ratio turns within reasonable practical bounds. As already indicated, given n bits in the first (most significant) group of bits, e.g. B1 to B12, the total number of turns required for the winding section Ni will be $2^n-1$, i.e. one less turn than twice the number of turns ($2^{n-1}$) in the most significant portion. When n=12, as in the above example, such number is relatively low. Similarly, given m bits in the second (less significant) group of bits, e.g. B13 to B20, the total number of turns required for the winding section Nj will be $2^m$, i.e. one less turn than twice the number of turns ($2^{m-1}$) in the most significant portion plus the single calibration turn Nx. When m=8, as in the above example, this number is even lower than for the first primary winding section. Since the number of turns in the secondary winding is equal to $2^n$, i.e. 4096, the total number of ratio turns comes out to only a few over 8,000, and yet the total number of bits n+m is 20.

Over the past decade, the requirements for analog-to-digital and digital-to-analog converters have undergone dramatic expansion. The extension in resolution alone, from the 10 to 12 bit capability of several years ago, to the 16 to 20 bit capability achievable today, implies not only at least a 64 fold increase in performance, but also represents a comparable increase in the number of discrete states available and a corresponding increase in the number of calibration points potentially required.

The present invention is not limited to splitting the primary winding into two sections. A split into three sections or more is possible and indeed may ultimately be desirable, especially if the number of bits were increased further, for example, to 24 bits.

Nor is the invention constrained by the number of bits assigned to each section of the primary winding. The split into 12 (most significant) bits for the first section and 8 (less significant) bits for the second section has been chosen for convenience, but these numbers can vary, e.g. two sections, each covering 10 bits.

We claim:

1. A converter for converting a series of digital input bits to an analog output, comprising
   (a) magnetic core means,
   (b) primary and secondary ratio windings coupled with the core means,
   (c) the primary winding being divided into at least two sections,
   (d) means for passing a first predetermined primary direct current through a first of said sections,
   (e) means controlled by a first group of the more significant input bits for varying the number of turns of said first section traversed by the first current,
   (f) means for passing a second predetermined primary direct current through a second of said sections,
   (g) means controlled by a second group of less significant input bits for varying the number of turns of said second section traversed by the second current,
   (h) means for passing a secondary direct current through the secondary winding, including means for varying said secondary current proportionally with the number of turns of the first primary section traversed by the first primary current,
   (i) means coupled with the core means for detecting a net ampere-turns unbalance of the primary and secondary currents in said ratio windings,
   (j) means controlled by said detecting means for further varying the secondary current to tend to bring said unbalance to zero, and
   (k) an analog output proportional to the secondary current.

2. A converter according to claim 1, wherein
   the number of turns of the first primary section is $2^n-1$, where n is the number of bits in said first group,
   the number of turns of the second primary section is $2^m$, where m is the number of bits in said second group,
   the ratio between the first primary current and the second primary current is $2^m$, and
   the number of turns of the secondary winding is $2^n$.

3. A converter according to claim 2, wherein n is not greater than twelve and m is not less than eight and not greater than twelve.

* * * * *